United States Patent
Regnier et al.

(10) Patent No.: US 9,035,712 B2
(45) Date of Patent: May 19, 2015

(54) RESONANCE REDUCING CIRCUIT BOARD

(75) Inventors: Kent E. Regnier, Lombard, IL (US); Patrick R. Casher, North Aurora, IL (US)

(73) Assignee: Molex Incorporated, Lisle, IL (US)

( * ) Notice: Subject to any disclaimer, the term of this patent is extended or adjusted under 35 U.S.C. 154(b) by 351 days.

(21) Appl. No.: 13/578,850

(22) PCT Filed: Feb. 15, 2011

(86) PCT No.: PCT/US2011/024881
§ 371 (c)(1),
(2), (4) Date: Oct. 23, 2012

(87) PCT Pub. No.: WO2011/100741
PCT Pub. Date: Aug. 18, 2011

(65) Prior Publication Data
US 2013/0141181 A1   Jun. 6, 2013

Related U.S. Application Data

(60) Provisional application No. 61/304,747, filed on Feb. 15, 2010.

(51) Int. Cl.
*H04B 3/28* (2006.01)
*H04B 3/32* (2006.01)
*H05K 1/11* (2006.01)
*H05K 1/16* (2006.01)
*H05K 1/02* (2006.01)

(52) U.S. Cl.
CPC .............. *H04B 3/32* (2013.01); *H05K 1/0219* (2013.01); *H05K 1/0233* (2013.01); *H05K 1/0234* (2013.01); *H05K 1/0248* (2013.01); *H05K 1/117* (2013.01); *H05K 1/165* (2013.01); *H05K 2201/09263* (2013.01); *H05K 2201/10636* (2013.01)

(58) Field of Classification Search
CPC ..... H05K 1/0234; H05K 1/165; H05K 1/167; H05K 1/0219; H05K 1/0248; H05K 2201/09263; H05K 2201/10636
USPC .......................................................... 333/12
See application file for complete search history.

(56) References Cited

U.S. PATENT DOCUMENTS

| 6,705,893 B1 | 3/2004 | Ko |
| 7,267,575 B1 | 9/2007 | Hwang |
| 8,614,398 B2 * | 12/2013 | Regnier et al. ............ 174/261 |

FOREIGN PATENT DOCUMENTS

| CN | 1310493 A | 8/2001 |
| JP | 09-199818 A | 7/1997 |
| WO | WO 2010/011753 A1 | 1/2010 |

OTHER PUBLICATIONS

International Search Report for PCT/US2011/024881.

* cited by examiner

*Primary Examiner* — Robert Pascal
*Assistant Examiner* — Kimberly Glenn
(74) *Attorney, Agent, or Firm* — Stephen L. Sheldon

(57) ABSTRACT

A circuit card is provided that includes ground traces that extend from a resistor to a commoning bar, where a resultant electrical length between the resistor and the commoning bar and is configured to reduce energy carried on the ground terminals that could otherwise result in cross-talk. In an embodiment, the ground trace may be configured in a meandering manner. In another embodiment, the ground trace may be split and joined by an inductor.

10 Claims, 5 Drawing Sheets

RESONANCE REDUCING CIRCUIT BOARD

This application is a national phase of PCT Application No. PCT/US2011/024881, filed Feb. 15, 2011, which in turn claims priority to U.S. Provisional Application No. 61/304,747, filed Feb. 15, 2010, which is incorporated herein by reference in its entirety.

BACKGROUND OF THE INVENTION

1. Field of the Invention

The present invention relates to the field of connectors, more specifically to connectors suitable for high data rates.

2. Description of Related Art

Connectors suitable for relatively high data rates (greater than 10 Gbps) are known. For example, upcoming standards for high-data rate connectors offer 10 Gbps per channel and some include 12 two-way channels. In order to be compatible with optical channel data rates, however, there is increasing interest in being able to offer 25 Gbps capable connectors.

One issue that has been observed is a tendency for energy on the ground structure in a connector to resonate as the signaling frequency increases such that the wave length of the signaling frequency approaches the electrical length of the terminals in the connector. For stacked connectors, it is difficult to shorten the terminals and therefore, as signaling frequencies of 10+ GHz, there tends to be substantial resonance in frequencies. It has been determined that for connector systems with terminals on a board mounted connector and a circuit card in a mating plug connector, it is possible to damped the resonance and reduce the resultant noise by employing a circuit card as illustrated in FIG. 1. As can be appreciated, two adjacent ground traces are coupled via a resistor to a median ground trace. The two adjacent ground traces and the median ground trace extend a distance until they are commoned together at an opposite end of the circuit card. More regarding this is construction and functionality is disclosed in International Patent Application No. PCT/US09/051409, which is incorporated herein by reference in its entirety. It has been determined that while such a design is effective, it tends to be difficult to package in certain applications. Therefore, certain individuals would appreciate a circuit card with additional improvements.

BRIEF SUMMARY OF THE INVENTION

A circuit card is provided that is suitable for use with high data rates and includes a resonance reduction circuit. In an embodiment, the circuit includes a meandering ground path so as to increase a time delay between a contact pad and a common ground area. In another embodiment the circuit includes a path with joined by an inductor and the inductor is configured to introduce additional time delay between the contact pad and a common area. By increasing the time delay between the contact pad and the common ground, resonance energy created by voltage potential between two distinct grounds terminals can be reduced.

BRIEF DESCRIPTION OF THE DRAWINGS

The present invention is illustrated by way of example and not limited in the accompanying figures in which like reference numerals indicate similar elements and in which.

DETAILED DESCRIPTION OF THE INVENTION

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

The embodiments below introduce a delay on the ground trace that extends between a resistor that couples a ground path to a median ground trace and a commoning bar. It has been determined that a distance between these points that provides an electrical length equal to a quarter wavelength of the frequency of interest will be sufficient to allow the resistor to be effective while shorter distances tend to cause the energy to "see" the short provided by the commoning bar rather than pass through the resistor. Therefore, the minimum length of a dampening circuit would generally be a distance that allowed the electrical length to be equal to a quarter wavelength of the frequency of interest.

Figure 1:
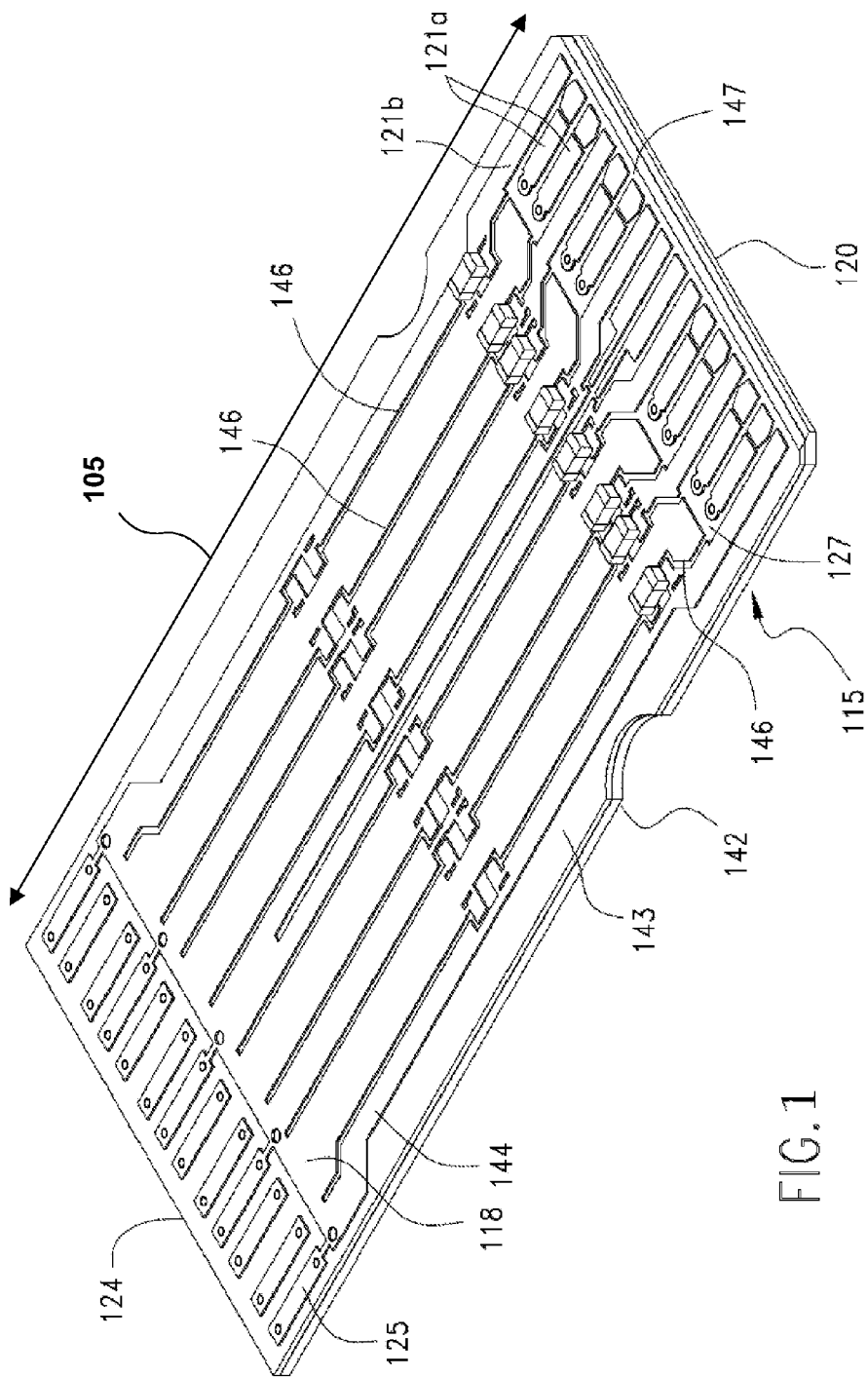
FIG. 1 illustrates a perspective view of an embodiment of a circuit card.

As can be appreciated from FIG. 1, circuit card 115 has a length 105 and includes a front edge 120 and a rear edge 124. Contact pads 121a can be used to receive signals while ground pads 121b can be coupled to ground connectors in a corresponding mating connector. The signal contacts 121a end in region 127 (with traces in another level 142 extending along the length 105) and a median ground trace 146 extends from there to commoning bar 118. Thus, as depicted, on layer 143 there are adjacent ground traces 144 that are coupled to a median ground trace 146 near the region 127 by a resistor and the adjacent ground traces extend a distance that equates to a ¼ wave length before reaching a commoning bar 118 (and then terminating at ground pads 125).

For certain applications it is expected that such a circuit card length, while effective, would be longer than desirable based on other packaging constraints. The embodiments discussed below provide an alternative to the need for the longer ground trace (and corresponding circuit card).

Figure 2:
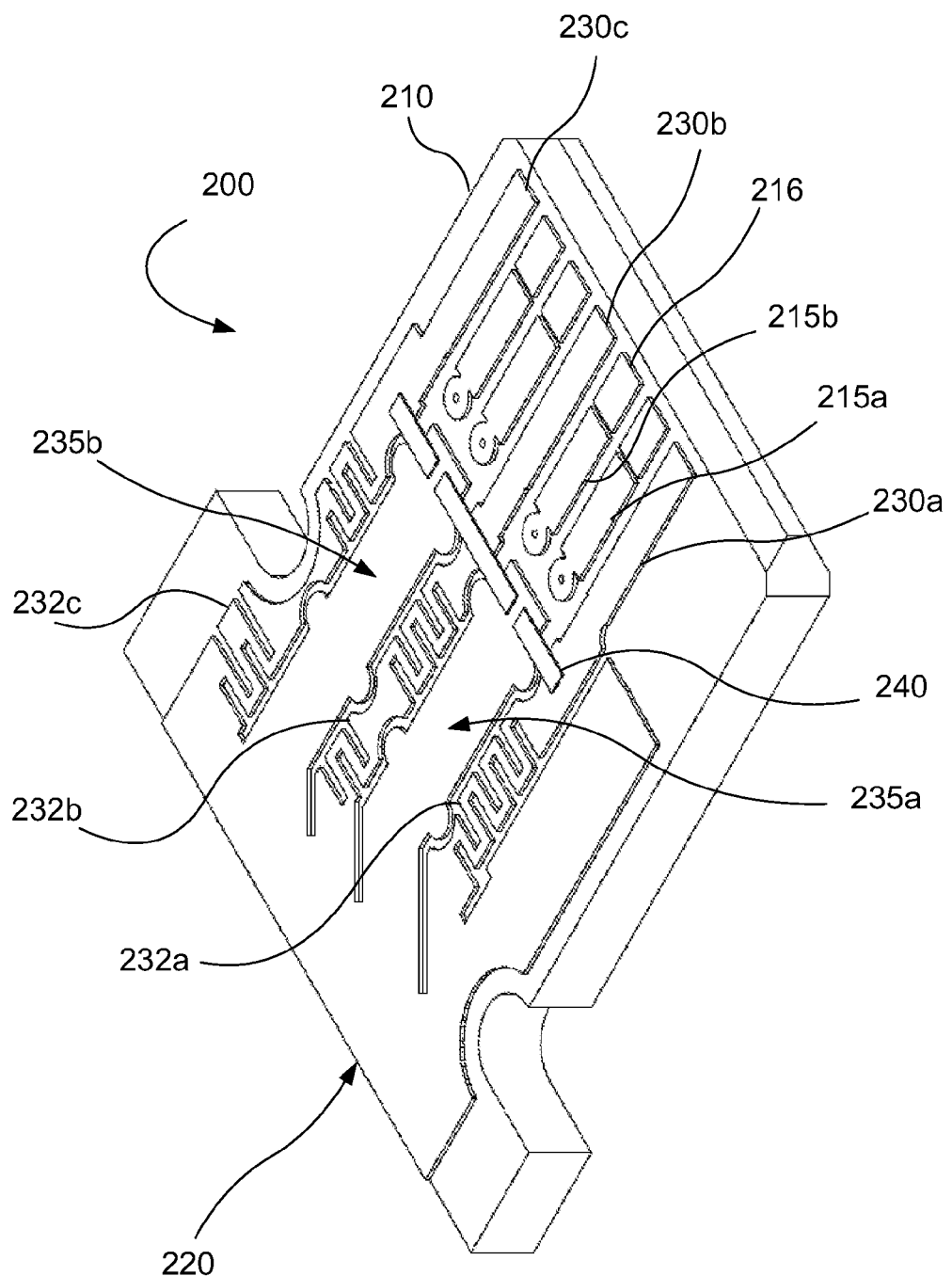
FIG. 2 illustrates a perspective view of an embodiment of a circuit card with a meandering ground path.
Figure 3:
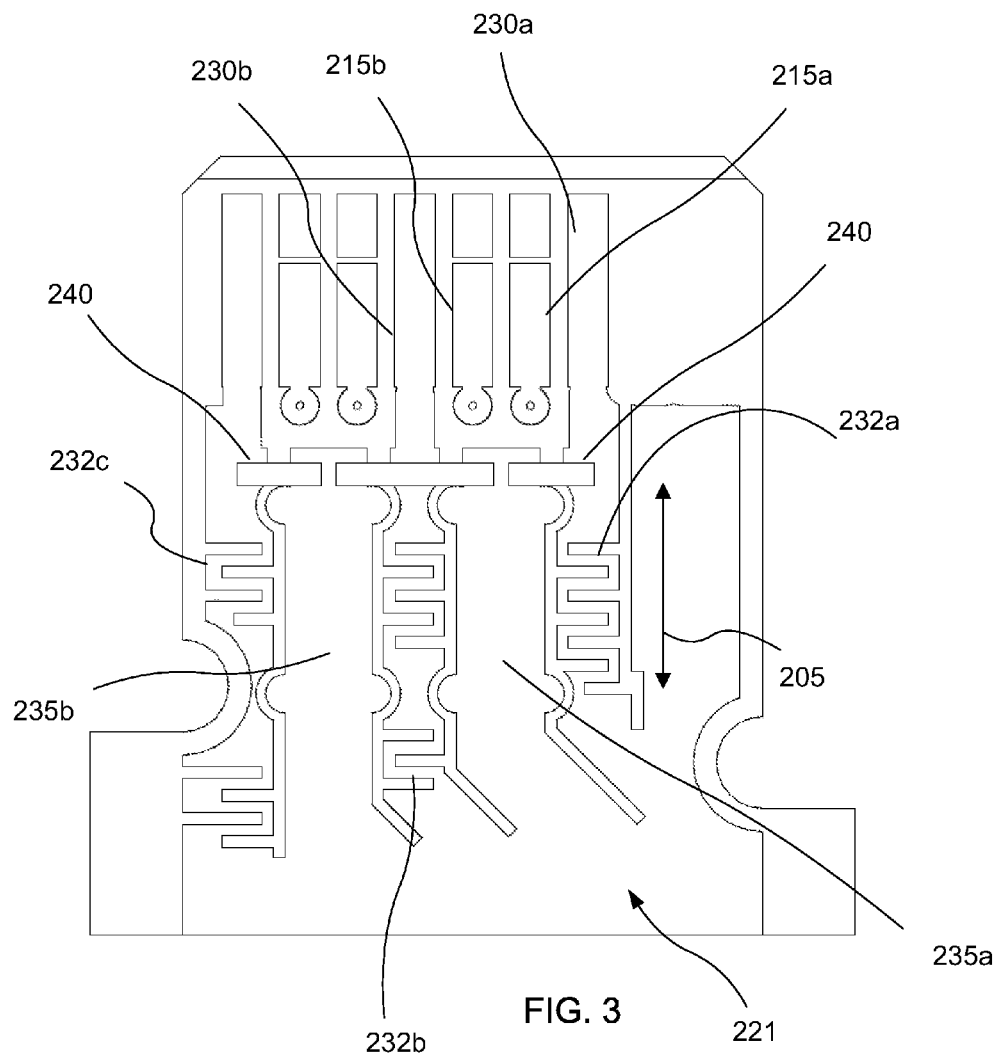
FIG. 3 illustrates an elevated plan view of the circuit card depicted in FIG. 2.

FIGS. 2-3 illustrate features of an embodiment of a circuit card 200 with a surface 210 to support a first layer 220 that includes a plurality of ground traces configured to dampen resonant energy. While certain aspects of circuit card 200 are similar to the design of the circuit card depicted in FIG. 1, the circuit card 200 includes a meandering path on the ground trace 232a, 232b, 232c extending between resistors 240 and a commoning bar 221. It should be noted that median ground trace 235a, 235b, however, does not meander although in another embodiment the median ground trace could meander. It has been determined that it is generally sufficient to increase the length of the ground traces 232a, 232b, 232c such that they have an electrical length of about ¼ of the wavelength of interest. Thus, the depicted embodiment allows for shorter connectors while allowing ground pads 230a, 230b to be a standard size. However, as can be appreciated from the Figures, the electrical length between the resistors 240 and the commoning bar 221 can be increased by providing a meandering path.

Consequentially, while distance 205 is kept short for packaging and costs reasons, the distance the ground trace travels can be more than double the actual distance. Thus, the distance from the signal pads to rear edge 220 can be substantially shortened while still providing for a desired trace travel distance (which is expected to correlate to a resultant electrical length). This improvement allows for a reduction in the amount of material that is used, as well as allowing for smaller external packages. Signal pads 215a, 215b can thus be provided in a convention manner, or as otherwise desired, and can include front sections 216 to help improve the electrical performance of the circuit card 200.

As can be appreciated, the meandering path is longer than the straight-line path. In an embodiment, the meandering path can be twice or even three times as long as a path that a corresponding straight-line section would provide. For example, in the embodiment depicted in FIGS. 2-3, the straight-line distance 205 is about 1.65 mm and the distance of an equivalent meandering path is about 5.2 mm, which is more than three times the straight-line distance. Or to put it another way, the straight-line distance between the resistor and the commoning bar is about 3.3 mm while the distance via the meandering path is about 7.8 mm (or more than double the length between the resistor and the commoning bar). Consequentially, assuming the materials used to create the meandering path are such that the resultant electrical length increases proportionally, it is possible to more than double the electrical length between the resistor and the commoning bar. Thus, a trace with a meandering path offers significant potential for increased electrical length, which provides a greater time delay versus what would be available if a hypothetical straight-line trace were used.

Figure 4:
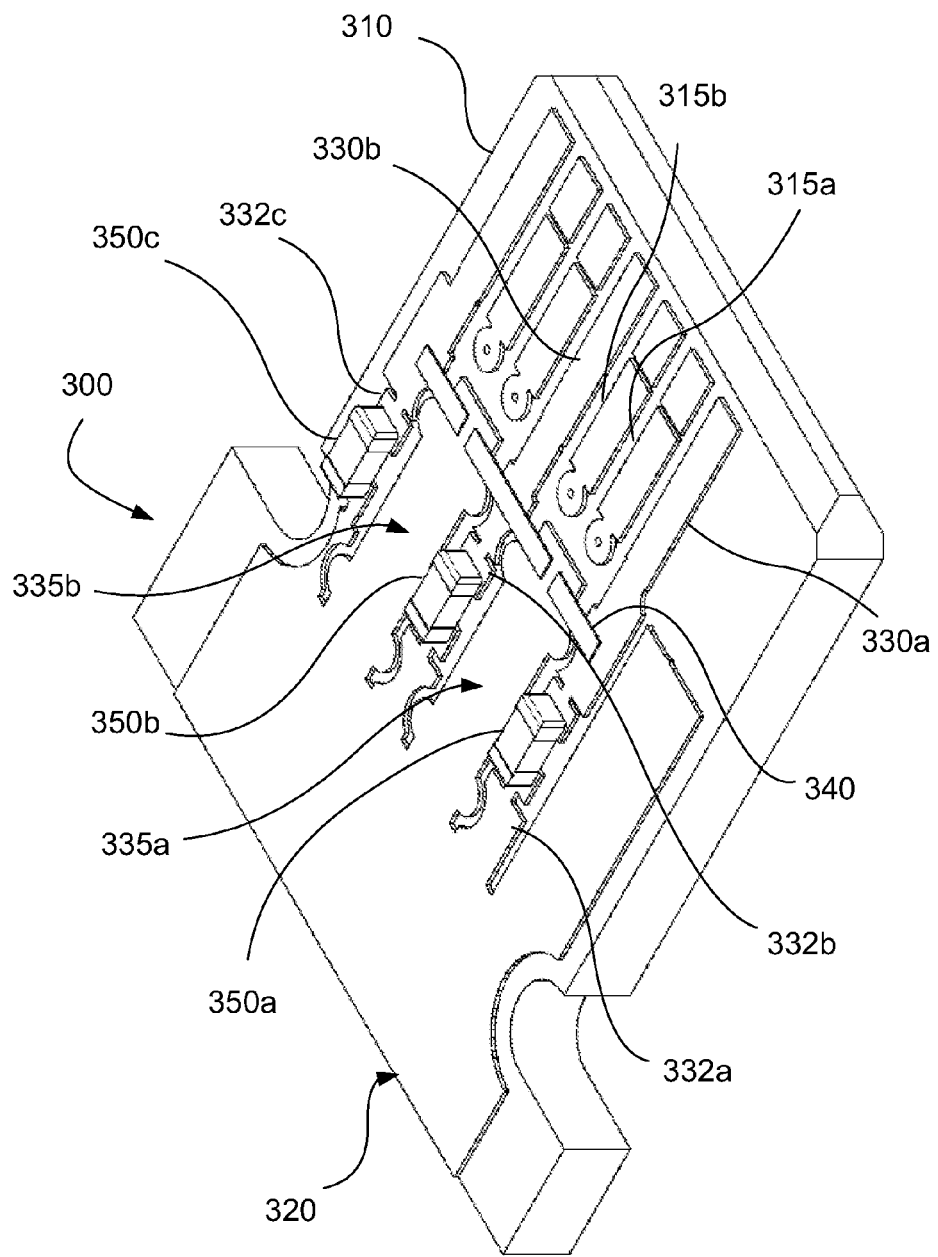
FIG. 4 illustrates a perspective view of an embodiment of a circuit card with a coupled ground path.
Figure 5:
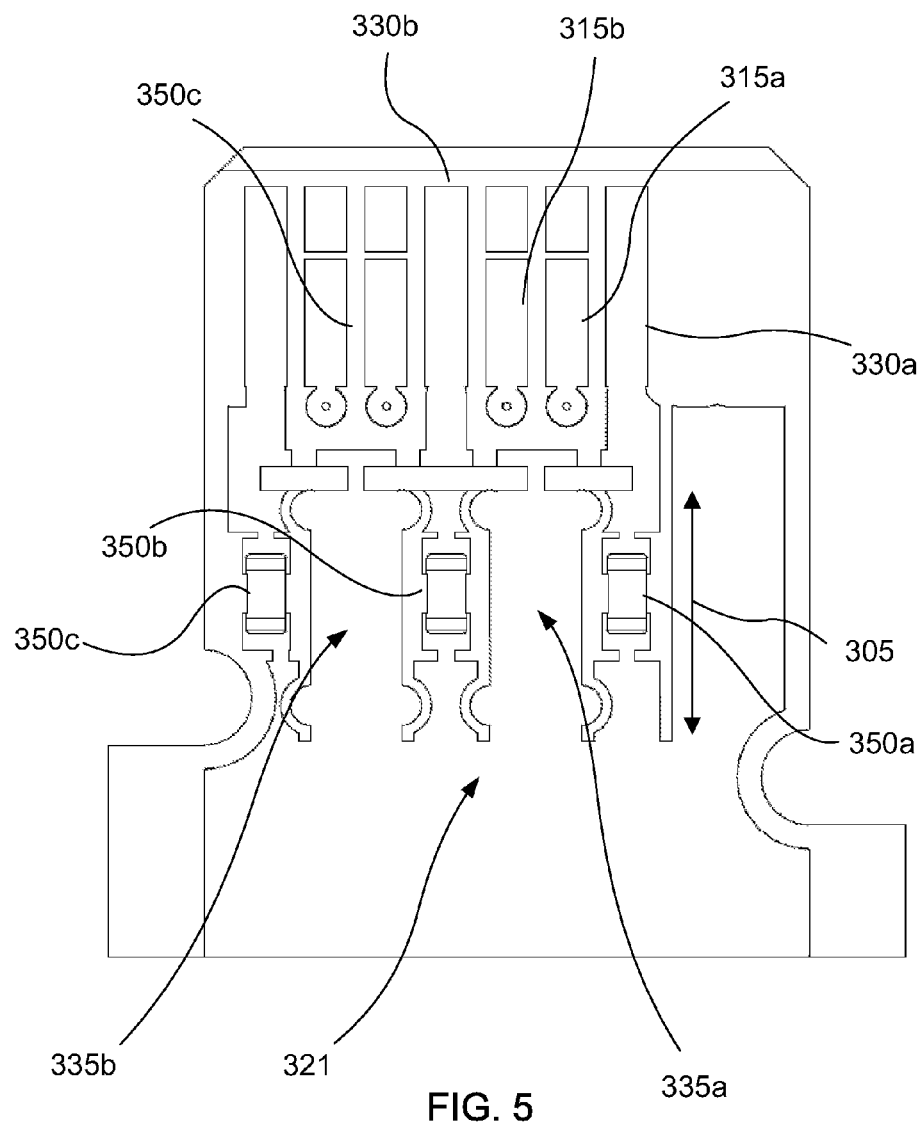
FIG. 5 illustrates an elevated plan view of the circuit card depicted in FIG. 4.

FIGS. 4-5 illustrate another embodiment of a circuit card 300. The circuit card 300 includes a surface 310 that supports a first layer 320. In a manner similar to the embodiment depicted in FIGS. 2-3, the first layer 320 includes signal pads 315a, 315b that are positioned between ground pads 330a, 330b, 330c. The ground pads 330a, 330b, 330c are connector to ground traces 332a, 332b, 332c which are respectively connected to median ground traces 335a, 335b by resistors 340. As depicted, the ground traces 332a, 332b, 332c are split and are connected together with an inductor 350a, 350b, 350c. Or to put it another way, the inductor bridges the split in the ground trace.

It has been determined that a inductor can introduce sufficient delay such that the energy passes through the resistor and is dampened rather than be reflected once energy reaches the commoning bar, even if the total length is less than ¼ wave length. Thus, the inductor can act to increase the electrical length of ground traces 332a, 332b, 332c and the inductors can be configured so that the resultant physical length of the circuit card between the resistor and a commoning bar 312 can be substantially reduced to length required to mount the inductors and little more. In an embodiment, for example, the length of the inductor can be a substantial fraction of a distance 305 between the resistor and the commoning bar. Thus, the circuit card can be configured so that the resultant electrical length is more than double the electrical length if the trace just extended straight between the resistor 340 and the commoning bar 321.

As can be appreciated, the use of an inductor allows for extremely short circuit card and this is beneficial when packaging constraints are significant. The meandering path, while potentially requiring a slightly longer circuit than might be needed with the inductor, still significantly reduces the required length compared to the straight trace version. Furthermore, the meandering trace design requires no additional components and therefore, depending on other requirements, may be less costly. It should be noted that in general the median ground trace can be shortened without concern for its electrical length as it has been determined that resonant dampening is not particularly sensitive to the length of the median ground trace. However, as can be appreciated, the ground trace can be configured so that the resultant electrical length of the ground trace is substantially greater than an electrical length of the median ground trace and in an embodiment it could be 50% greater, 100% greater (e.g., double) or more than 100% greater.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A circuit card, comprising:
   a pair of signal pads;
   a first and second ground pad positioned on opposite sides of the pair of signal pads;
   a first ground trace electrically connected to the first ground pad;
   a second ground trace electrically coupled to the second ground pad;
   a median ground trace;
   a first resistor connecting the first ground trace to the median ground trace;
   a second resistor connector the second ground trace to the median ground trace; and
   a commoning bar that connects the first ground trace, the second ground trace and the median ground trace together, wherein a first electrical length of the first ground trace between the resistor and the commoning bar is substantially greater than a second electrical length of a hypothetical trace that extends in a straight line between the resistor and the commoning bar.

2. The circuit card of claim 1, wherein the first ground trace is configured to meander between the resistor and the commoning bar so as increase the physical distance that is traveled by the ground trace by at least 3 mm.

3. The circuit card of claim 2, wherein the meander causes the first electrical length to be at least 50% greater than the second electrical length.

4. The circuit card of claim 2, wherein the meander causes the first electrical length to be at least double the second electrical length.

5. The circuit card of claim 1, wherein the first ground trace is split, the circuit card further comprising an inductor that bridges the split.

6. The circuit card of claim 5, wherein the inductor is configured to cause the first electrical length to be at least 50% greater than the second electrical length.

7. The circuit card of claim 5, wherein the inductor is configured to cause the first electrical length to be at least double the second electrical length.

8. The circuit card of claim 2, wherein the second ground trace is configured to meander between the resistor and the commoning bar so as increase the physical distance that is traveled by the ground trace by at least 3 mm, the second ground trace having a third electrical length.

9. The circuit card of claim 8, wherein the meander in the second ground trace causes the third electrical length to be at least 50% greater than the second electrical length.

10. The circuit card of claim 8, wherein the meander in the second ground trace causes the first electrical length to be at least double the second electrical length.

* * * * *